United States Patent
Thors

(10) Patent No.: US 7,861,408 B2
(45) Date of Patent: Jan. 4, 2011

(54) HEAT TRANSFER SURFACE FOR ELECTRONIC COOLING

(75) Inventor: Petur Thors, Decatur, AL (US)

(73) Assignee: Wolverine Tube, Inc., Huntsville, AL (US)

(*) Notice: Subject to any disclaimer, the term of this patent is extended or adjusted under 35 U.S.C. 154(b) by 0 days.

(21) Appl. No.: 11/447,327

(22) Filed: Jun. 6, 2006

(65) Prior Publication Data

US 2006/0283573 A1    Dec. 21, 2006

Related U.S. Application Data

(60) Provisional application No. 60/688,254, filed on Jun. 7, 2005.

(51) Int. Cl.
  *B21D 53/02* (2006.01)
  *H05K 7/20* (2006.01)

(52) U.S. Cl. ............ 29/890.03; 165/80.4; 165/133; 165/185; 361/700

(58) Field of Classification Search .......... 165/80.2, 165/80.3, 80.4, 80.5, 185, 133; 361/699, 361/700, 703; 257/706, 707, 722; 29/890.03
See application file for complete search history.

(56) References Cited

U.S. PATENT DOCUMENTS

| | | | | |
|---|---|---|---|---|
| 4,369,838 A * | 1/1983 | Asanuma et al. ........... 165/185 |
| 4,619,316 A * | 10/1986 | Nakayama et al. ..... 165/104.33 |
| 5,314,738 A * | 5/1994 | Ichikawa .................... 428/182 |
| 5,412,535 A * | 5/1995 | Chao et al. .................. 361/700 |
| 5,642,776 A * | 7/1997 | Meyer et al. ........... 165/104.26 |
| 5,697,430 A * | 12/1997 | Thors et al. ................. 165/133 |
| 5,740,014 A * | 4/1998 | Lin ............................. 361/697 |
| 5,761,037 A * | 6/1998 | Anderson et al. ........... 361/700 |
| 5,775,187 A | 7/1998 | Nikolai et al. |
| 6,691,769 B2 * | 2/2004 | Johnson et al. ............. 165/80.3 |
| 6,766,817 B2 | 7/2004 | da Silva |
| 2002/0179284 A1 * | 12/2002 | Joshi et al. ................. 165/80.3 |
| 2004/0069467 A1 * | 4/2004 | Thors et al. ................. 165/133 |
| 2004/0112585 A1 * | 6/2004 | Goodson et al. ............ 165/299 |
| 2005/0145377 A1 | 7/2005 | Thors et al. |

FOREIGN PATENT DOCUMENTS

JP    58-70919    4/1983

OTHER PUBLICATIONS

Micro Deformation Technology (MDT) slide show, Wolverine Tube, Inc., www.wlv.com/mdt/Micro%20Deformation%20Technology_files/slide0188htm, Jul. 2002.

* cited by examiner

*Primary Examiner*—Leonard R Leo
(74) *Attorney, Agent, or Firm*—Kilpatrick Stockton LLP; Kristin J. Doyle

(57) ABSTRACT

A cooling surface for cooling an electronic component, the surface having two sets of fins, each set of fins defining a set of channels, and a number of passageways connecting the sets of channels. The cooling surface can be attached to an electronic component, such as a chip, and refrigerant supplied to at least one of the sets of channels. When the temperature of the electronic component rises, the heat is transferred to the refrigerant in the cooling surface, at least some of which vaporizes to carry heat away from, and facilitate cooling of, the component.

4 Claims, 7 Drawing Sheets

HEAT TRANSFER SURFACE FOR ELECTRONIC COOLING

RELATED APPLICATIONS

This application claims priority to U.S. Provisional Application Ser. No. 60/688,254, filed Jun. 7, 2005 and entitled "Heat Transfer Surface For Electronic Cooling," the entirety of which is hereby incorporated by reference.

FIELD OF THE INVENTION

The invention generally relates to a cooling surface that can be conductively attached to and cool electronic components.

BACKGROUND OF THE INVENTION

Electronic devices, such as computers, process information on computer chips and these chips generate heat during use. The faster or longer the chips process information the hotter they become. If the chips become too hot they will burn up or otherwise malfunction. Thus, structures are provided in electronics to cool the chips during processing. For example, computers have fans that activate if the computer detects that the chips are getting too hot. Moreover, computers will also slow processing if it detects the chips are getting too hot. These conventional cooling methods are often ineffective because they do not cool the electronic components sufficiently to prevent damage to the components.

In other conventional cooling devices and methods, conductive structures are attached adjacent to the chip to conduct heat away from the chip to those structures. Such structures can take a variety of forms. For example, copper blocks have been attached to chips so that the heat conducts from the chip to its attached block. Fins have been provided on a single surface of such blocks to enhance heat transfer. Oftentimes these structures cannot cool the chips sufficiently, however, so ultimately the chips burn up or otherwise malfunction.

SUMMARY OF THE INVENTION

This invention provides a cooling surface for electronic components, such as electronic chips, that better facilitates electronic cooling. While for ease of discussion the cooling surface is described for use with an electronic chip, applicants in no way intend that the surface be used only with electronic chips. Rather, one of skill in the art will recognize that the surface may be used with any electronic component for which facilitation of cooling is desirable. A first set of fins that define a first set of channels is provided on one side of the surface. The first set of fins and channels are oriented on the surface at a first orientation. A second set of fins that define a second set of channels is provided on the side of the surface opposite the first set of fins and channels. The second set of fins and channels are oriented on the surface at a second orientation, preferably at an angle relative to the first orientation. Passageways connecting the first and second set of channels extend through the surface.

The cooling surface is attached to an electronic chip. The tips of the first set of fins can be flattened to facilitate attachment of the cooling surface (via the first fins) to the electronic chip. Liquid refrigerant is supplied to at least one of the sets of channels, preferably the first set of channels proximate to the electronic chip. As liquid is supplied to the cooling surface, the first set of channels fills with liquid refrigerant. The liquid refrigerant flows through the passageways and into the second set of channels. In so doing, the liquid refrigerant coats the walls of the sets of fins.

As the electronic chip rises in temperature, the cooling surface conducts heat away from the chip. The heat is then transferred to the refrigerant that is coated on the fins of the cooling surface. At least some of the refrigerant vaporizes, and the resulting vapors escape through the passageways in the surface and away from the chip.

There is provided an electronics cooling surface, a method of forming an electronics cooling surface, and an electronics cooling system.

The invention is pointed out with particularity in the appended claims. To gain an improved understanding of the advantages and features of the current invention, reference may be made to the following drawings and descriptive matter.

DETAILED DESCRIPTION OF EMBODIMENTS

Figure 1:
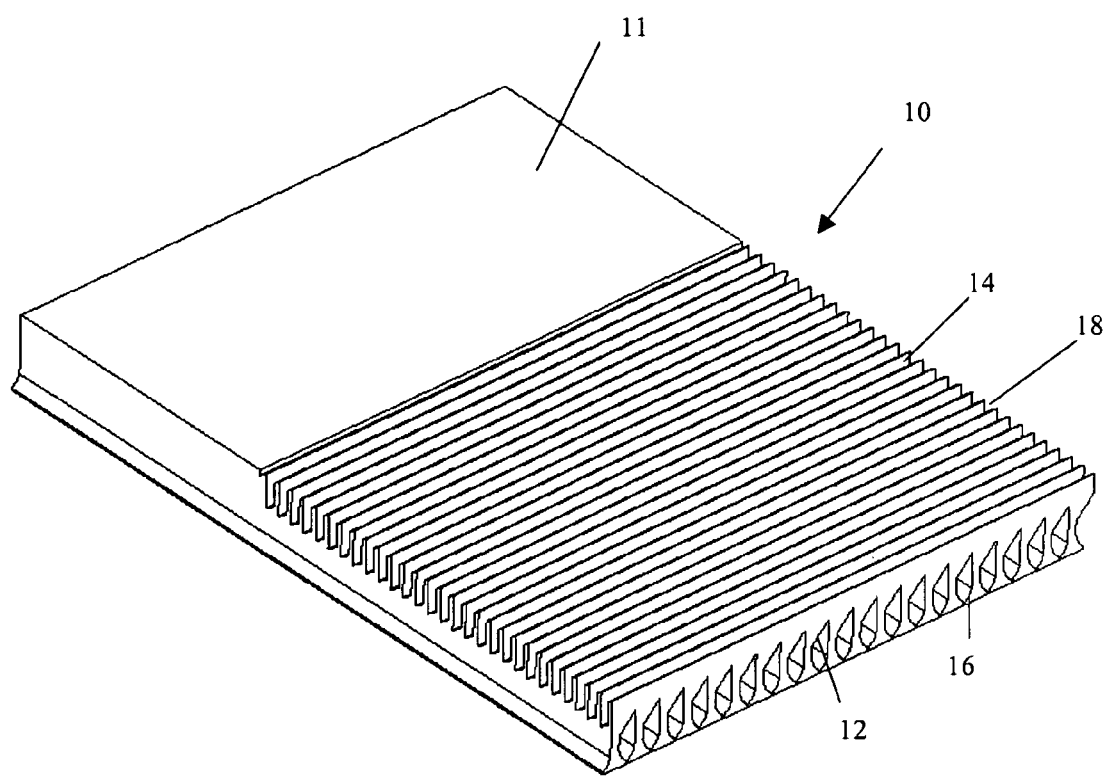
FIG. 1 is a perspective view of a cooling surface according to one embodiment of the invention.

FIG. 1 illustrates one embodiment of a partially-formed surface 10 of this invention. The surface 10 includes two sets of channels 12, 14 formed by two sets of fins 16, 18, respectfully. The surface 10 is preferably, but does not have to be, attached to a microchip 44 (see FIG. 11) so that the lower set of channels 12 is positioned adjacent to the chip 44 and runs in a first direction and the upper set of channels 14 is positioned above the lower set of channels 12 and runs in a second direction that is at an angle to the first direction. The sets of channels 12, 14 are preferably interconnected to one another by a plurality of passageways 20 (see FIG. 9).

The surface 10 is preferably formed from a blank of conductive material, such as metal (including copper, titanium, aluminum, gold, stainless steel, etc.) and more preferably copper. The surface 10 can be formed of any highly-conductive material, however, such as a carbide with a high carbon content. Carbon itself could be used to form the surface 10.

FIG. 1 illustrates a partially-formed surface 10 formed from a blank 11. In a finished surface 10, fins 16, 18 are preferably, but do not have to be, formed over the entirety of the blank 11. To form the surface 10, a lower set of upstanding fins 16 is formed on one side of the blank 11, thereby creating the lower set of channels 12 between the adjacent fins 16. An upper set of upstanding fins 18 is then formed on the opposite side of the blank 11, thereby creating the upper set of channels 14 between the adjacent fins 18. The sets of fins 16, 18 may be formed by many methods known in the art, but preferably are formed by cutting the sets of fins 16, 18 and subsequently lifting the sets of fins 16, 18 to a desirable angle. More specifically, the sets of fins 16, 18 are formed by cutting layers in the surface of the blank 11 and lifting the cut layers to a desirable angle to form upstanding sets of fins 16, 18. This cutting and lifting method and a tool for performing this method are disclosed in co-pending applications US 2004-0069467 and US 2005-0145377, the entirety of which are hereby incorporated by reference. While the sets of fins 16, 18 may be formed on a flat blank, in a preferable method, the uncut blank is wrapped around a rotatable drum so that the surface of the blank is curved in a semi-circle. In this configuration, the blank emulates a tube surface and conventional tube surface enhancement techniques may be used on each side of the blank to form fins 16, 18. It makes no difference which set of fins 16, 18 (and thus which set of channels 12, 14) are formed in the blank first.

Figure 9:
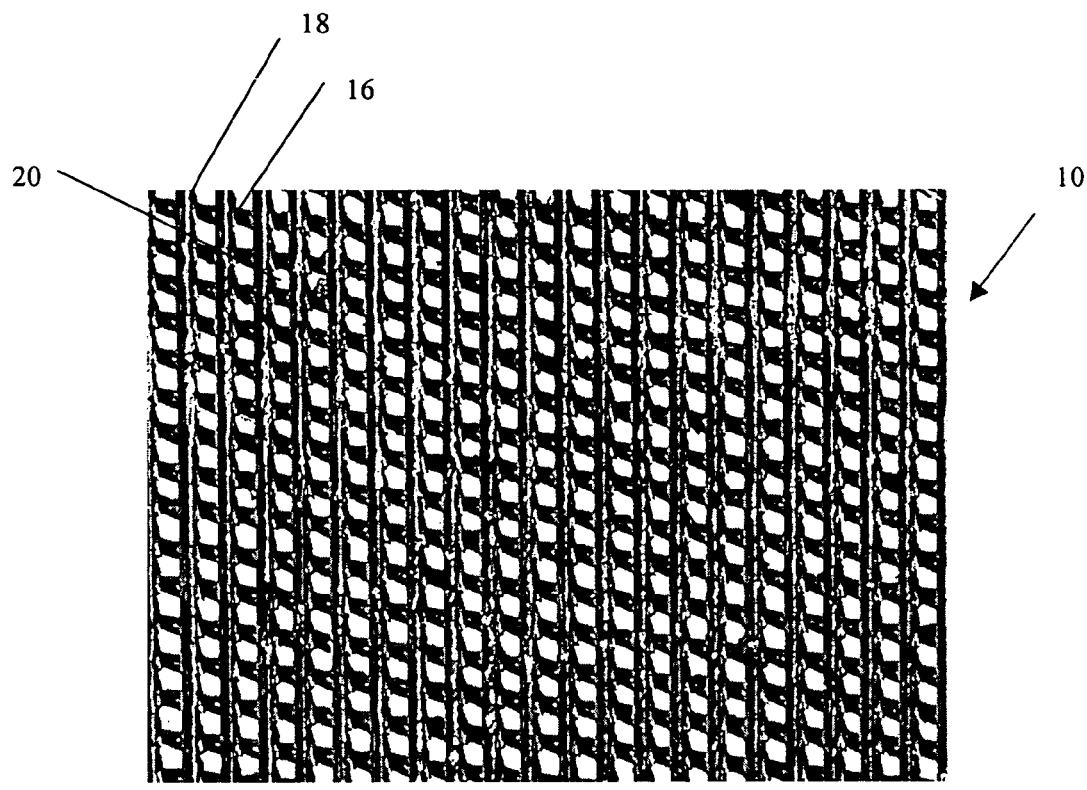
FIG. 9 is a photomacrograph of a top plan view of an electronics cooling surface in accordance with an embodiment of the invention.
Figure 10:
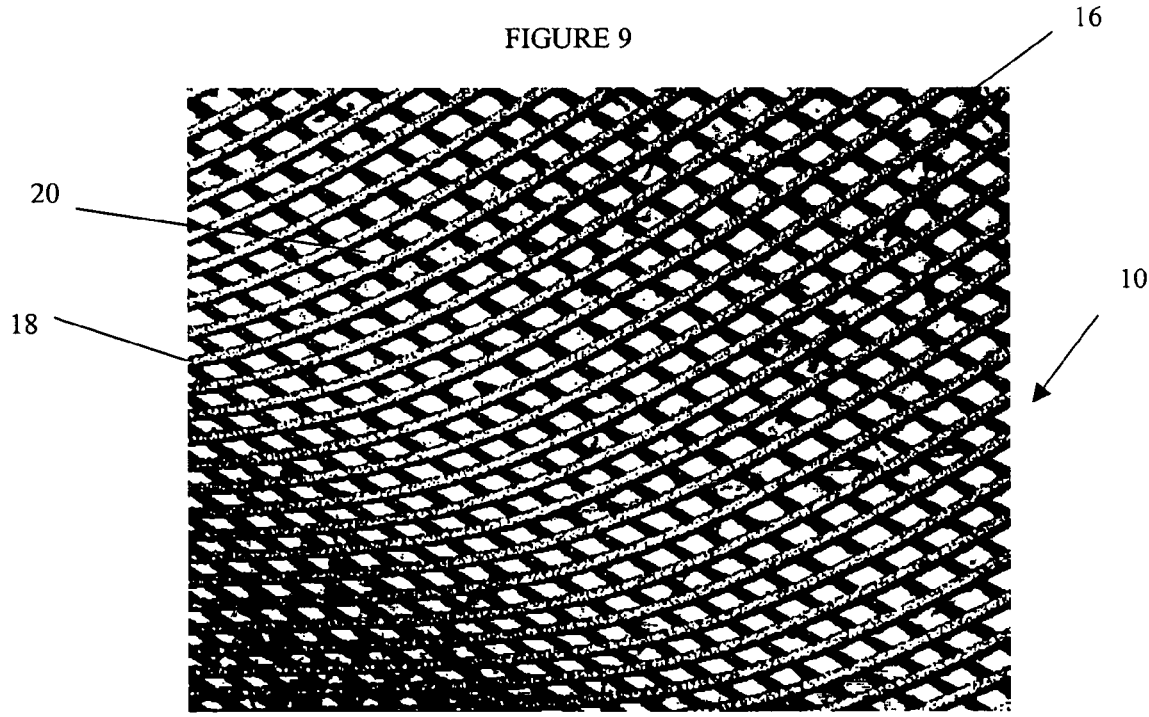
FIG. 10 is a photomacrograph of a top plan view of an electronics cooling surface in accordance with an embodiment of the invention, shown after stretching.

It is preferable, but not necessary, that channels 12, 14 formed by fins 16, 18 extend slightly beyond the centerline of the thickness of the blank 11. In this way, passageways 20 (see FIG. 9) are formed at the intersection of and extend between the upper and lower set of channels 12, 14. The portion of channel 12 that extends beyond the centerline of the blank intersects with the corresponding portion of channel 14 that extends beyond the centerline. This intersection forms a passageway 20 between the two channels 12, 14. FIGS. 9 and 10 illustrate the passageways 20. While it is preferable that the channels of both sets of channels 12, 14 extend beyond the centerline of the blank thickness, the channels of only one set of channels 12, 14 may so extend to form the passageways 20.

While the sets of fins 16, 18 (and thus the resulting sets of channels 12, 14) of FIG. 1 are shown oriented perpendicular to each other, the sets of fins 16, 18 may be formed at any angle relative to each other. Furthermore, the fins within the upper and/or lower sets of fins 16, 18 (and thus the channels within the upper and/or low sets of channels 12, 14) need not be parallel to each other.

Any number of fins 16, 18 (and thus any number of channels 12, 14) may be formed on the cooling surface 10. "Fin pitch" as used herein is defined as the width of a single channel plus the thickness of one of the fins defining the channel. The fin pitch of the upper and lower sets of fins 16, 18 is preferably, but does not have to be, between 20-1200 fins per inch. The fin pitch may vary between the lower and upper sets of fins 16, 18 so that the lower set of fins 16 has a different fin pitch than the upper set of fins 18. Also, the fin pitch can vary within each set of fins 16, 18, so that for example a portion of the upper set of fins 18 has a different fin pitch than another portion of the upper set of fins 18.

Moreover, the height of the fins 16, 18 (and thus the depth of the upper and lower channels 12, 14) may also vary between the sets of fins 16, 18 so that the lower set of fins 16 has a different fin height than the upper set of fins 18. Similarly, the fin height can vary within each set of fins 16, 18, so that for example a portion of the upper set of fins 18 has a different fin height than another portion of the upper set of fins 18.

The optimal geometries of the sets of fins 16, 18 and the sets of channels 12, 14 will depend on a number of factors, including the type of refrigerant used and the amount of heat needed to be conducted away from the surface 10. It is preferable, but not necessary, that the aspect ratio A for each set of fins 16, 18 (defined as the fin height divided by the channel width) be in the range between $0.1<A<400$ and more preferably between $0.1<A<40$.

Figure 3:
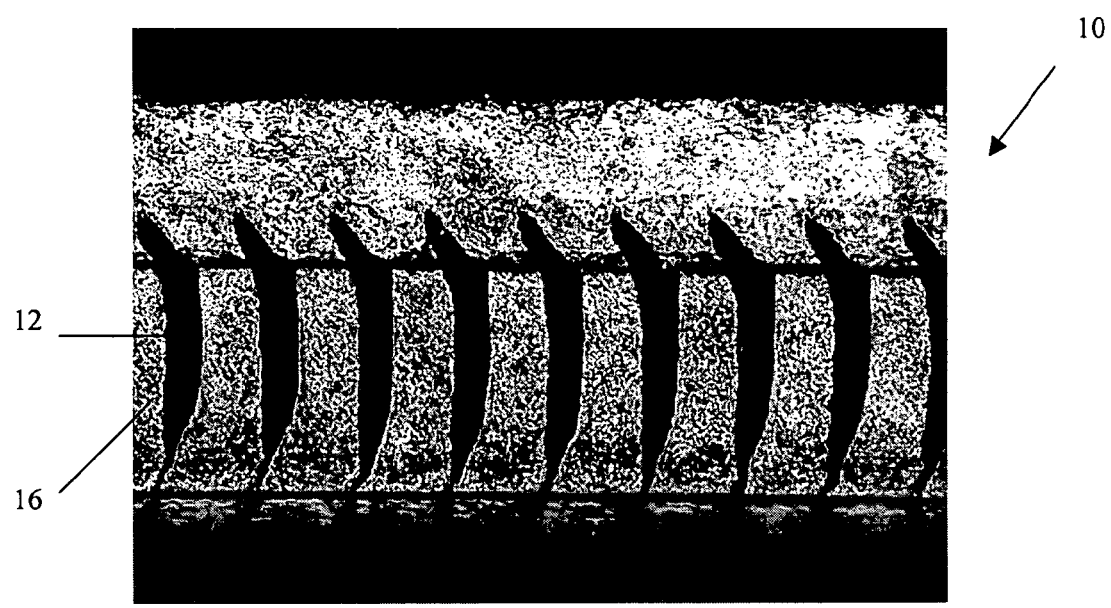
FIG. 3 is a photomicrograph of a cross-sectional view of the lower fins of a cooling surface according to an embodiment of the invention.
Figure 4:
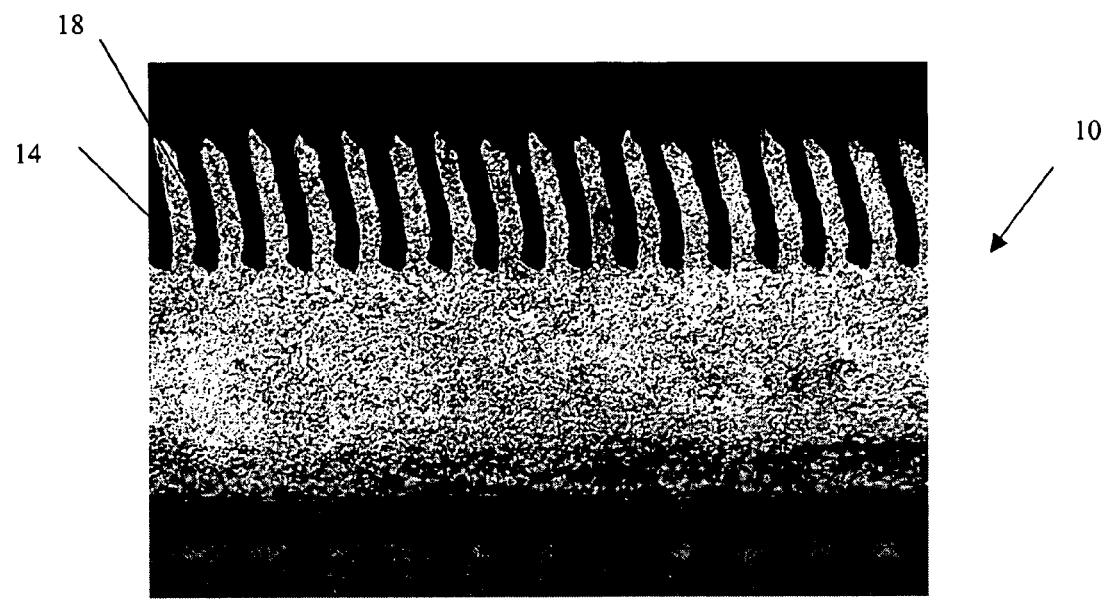
FIG. 4 is a photomicrograph of a cross-sectional view of the upper fins of a cooling surface according to an embodiment of the invention.
Figure 5:
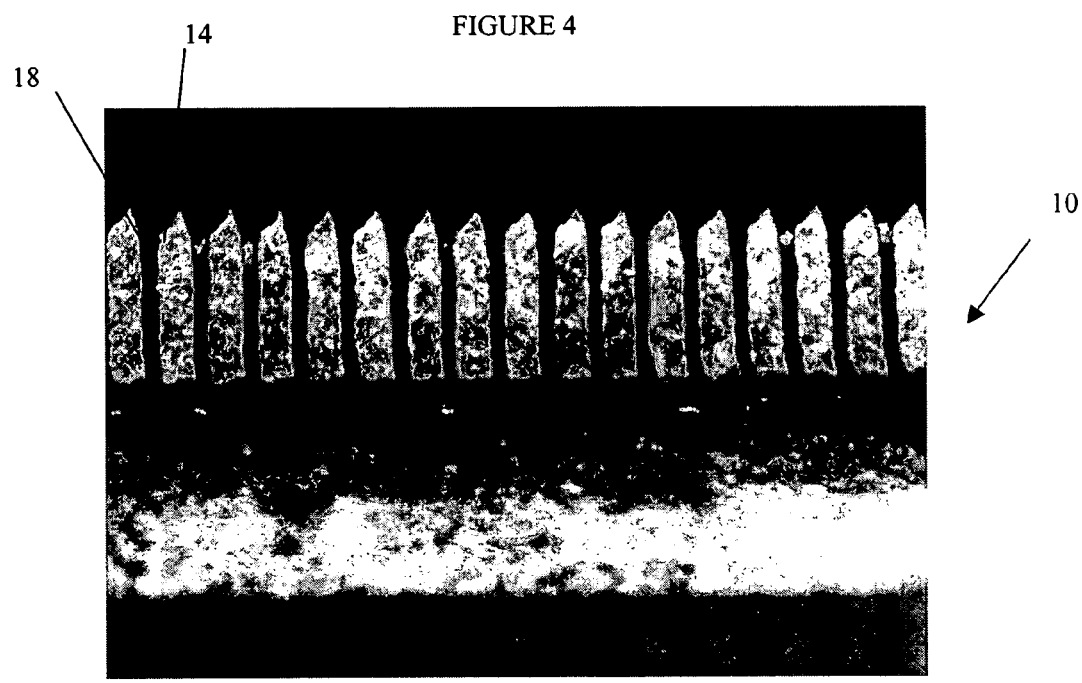
FIG. 5 is a photomicrograph of a cross-sectional view of the upper fins of a cooling surface according to another embodiment of the invention.
Figure 6:
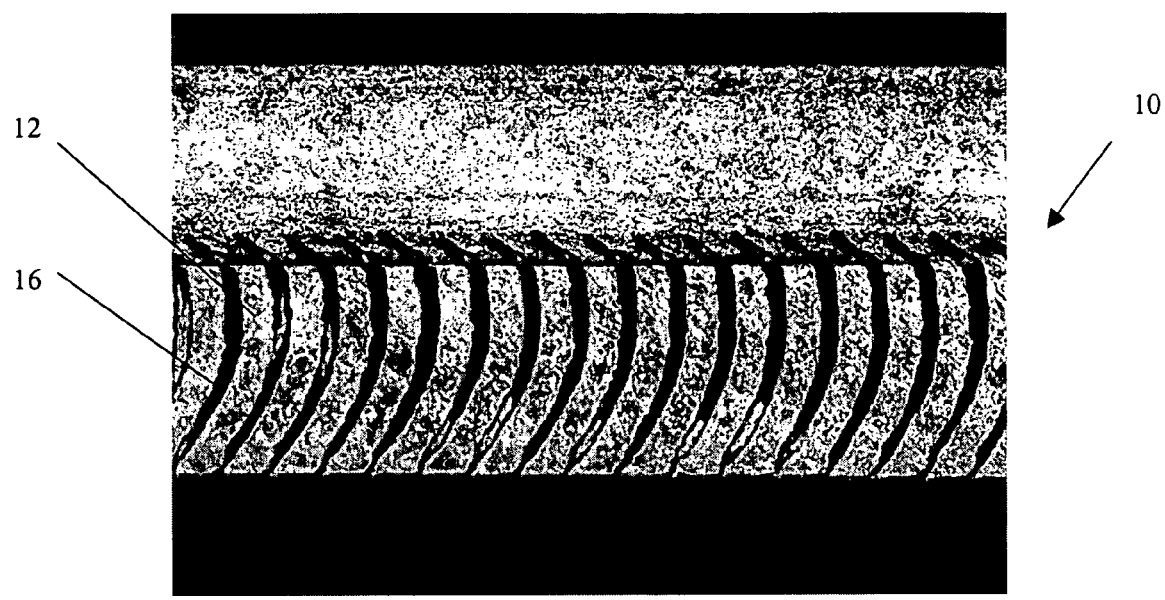
FIG. 6 is a photomicrograph of a cross-sectional view of the lower fins of a cooling surface according to another embodiment of the invention.
Figure 7:
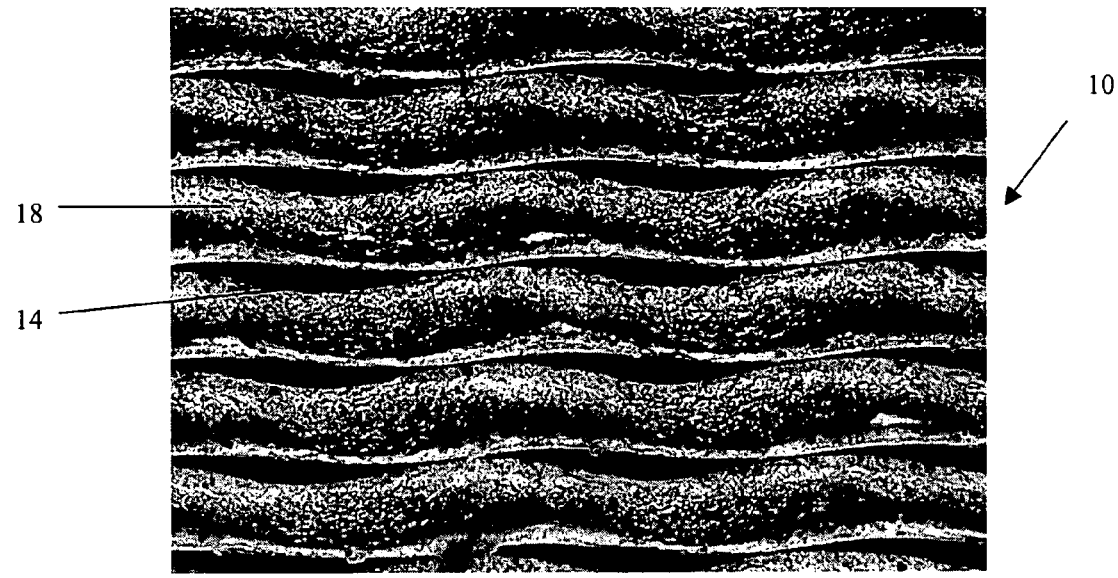
FIG. 7 is a photomicrograph of a top plan view of a cooling surface according to still another embodiment of the invention.

FIG. 3 is a cross-sectional view showing the lower set of channels 12 of surface 10 formed by fins 16 having a fin pitch of 100 fins/inch and a fin height of 0.023 inches. FIG. 4 is a cross-sectional view showing the upper set of channels 14 of surface 10 formed by fins 18 having a fin pitch of 200 fins/inch and a fin height of approximately 0.0205 inches. FIG. 5 is a cross-sectional view showing the upper set of channels 14 of surface 10 formed by fins 18 having a fin pitch of 200 fins/inch and a fin height of approximately 0.0175 inches. FIG. 6 is a cross-sectional view showing the lower set of channels 12 of surface 10 formed by fins 16 having a fin pitch of 200 fins/inch and a fin height of approximately 0.021 inches. FIG. 7 is a plan view of the upper set of fins 18 forming channels 14.

In use, surface 10 is preferably attached to a chip 44 so that the lower set of channels 12 is proximal the chip. The surface 10 can be attached to the chip 44 in any number of ways, including by soldering or using an adhesive or paste. It is preferable that the adhesive or paste used be conductive to further facilitate cooling of the chips 44.

Figure 2:
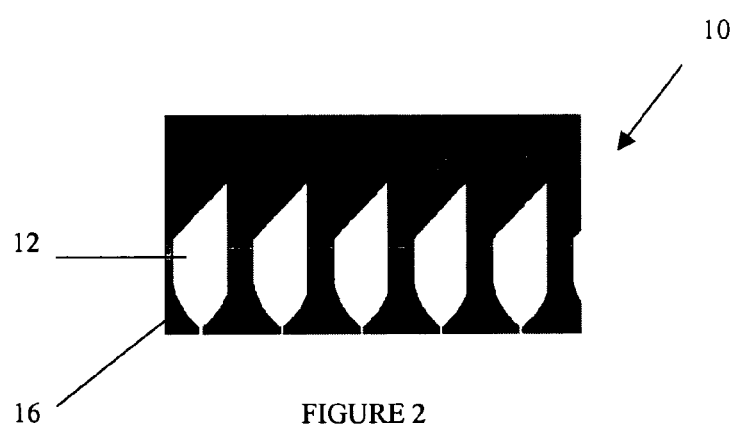
FIG. 2 is a partial end view of the cooling surface of FIG. 1 illustrating the lower fins.
Figure 8:
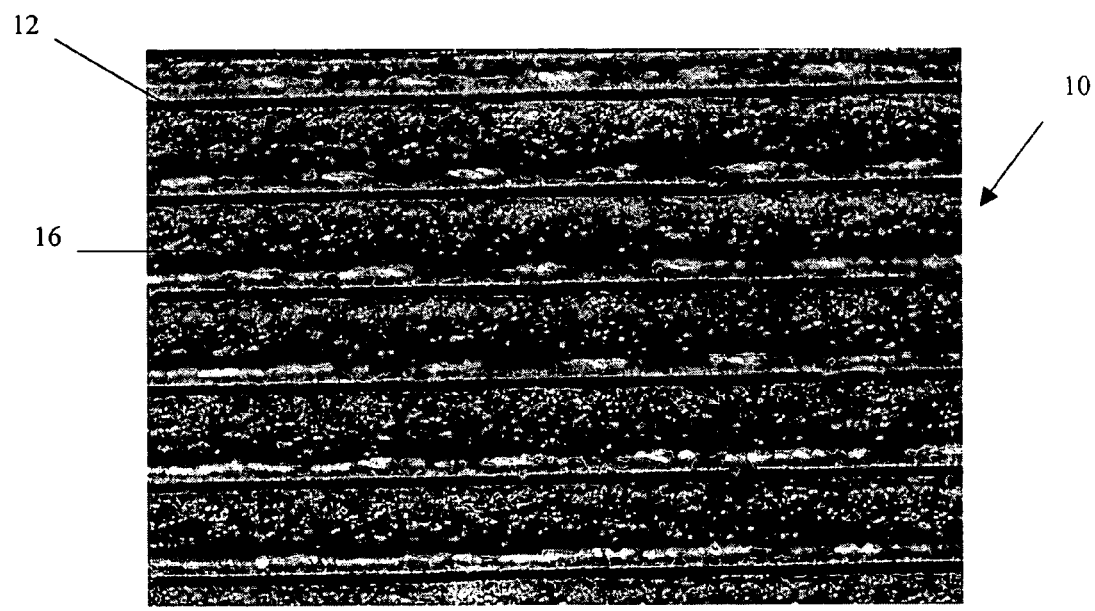
FIG. 8 is a photomicrograph of a bottom plan view of a cooling surface according to still another embodiment of the invention.

To facilitate attachment and retention of the surface 10 on and to a chip 44, it is preferable, but not necessary, that the tips of the lower set of fins 16 be flattened, as shown in FIGS. 2, 3, and 6. Such flattening creates additional surface area for attachment to the chip 44. Moreover, the additional surface area provided by flattened tips of the lower set of fins 16 assists in the conduction of heat. FIG. 8 is a plan view of the lower set of fins 16 forming channels 12. The fins of the lower set of fins 16 have been flattened.

The tips of the set of fins 16 may be flattened using conventional flattening techniques or those described in US 2005-0145377, incorporated herein by reference. In addition to flattening, the tips of the set of fins 16 may also be bent over to form a relatively flat surface or cut so as to have thickened tips and thus create more surface area at the tips for attachment. Methods and tools for bending and thickening fin tips, as well as angling adjacent fin tips relative to each other (which is also contemplated by this invention), are also described in US 2005-0145377. It is within the scope of the present invention to flatten or otherwise enhance the tips of the upper set of fins 18 in addition to or instead of flattening the tips of the lower set of fins 16.

During chip 44 use, a liquid refrigerant is supplied to at least one of the sets of channels 12, 14. It is preferred that refrigerant is supplied at least to the lower set of channels 12. Any number of refrigerants can be used, including but not limited to water or HFE-7100, which is manufactured by 3M. Alternatively, manufacturers such as DuPont or Allied Signal manufacture refrigerants known as 134A or 123 that are also appropriate for use in the current invention. The refrigerant runs through the lower set of channels 12 to coat the surface of the lower set of fins 16. As the lower set of channels 12 becomes filled with the refrigerant, the refrigerant is discharged through the passageways 20, and into the upper set of channels 14 to coat at least some of the surface of the upper set of fins 18. In another embodiment, refrigerant may be supplied directly to the upper set of channels 14 instead of or in addition to supplying refrigerant to the lower set of channels 12.

The heat generated by the chip 44 is transferred to the conductive surface 10. By virtue of this heat transfer, the temperature of the liquid refrigerant in channels 12, 14 elevates, converting at least some of the liquid refrigerant to vapor. At least some of the vapor produced in the lower set of channels 12 is discharged through passageways 20 and into the upper set of channels 14, thereby carrying heat away from the chip 44. Moreover, as the refrigerant that is not vaporized flows through and exits the sets of channels 12, 14, heat generated by the chip 44 is carried away in that refrigerant. In this way, heat generated by the chip 44 is carried away by the refrigerant, either in liquid or vapor form.

Figure 11:
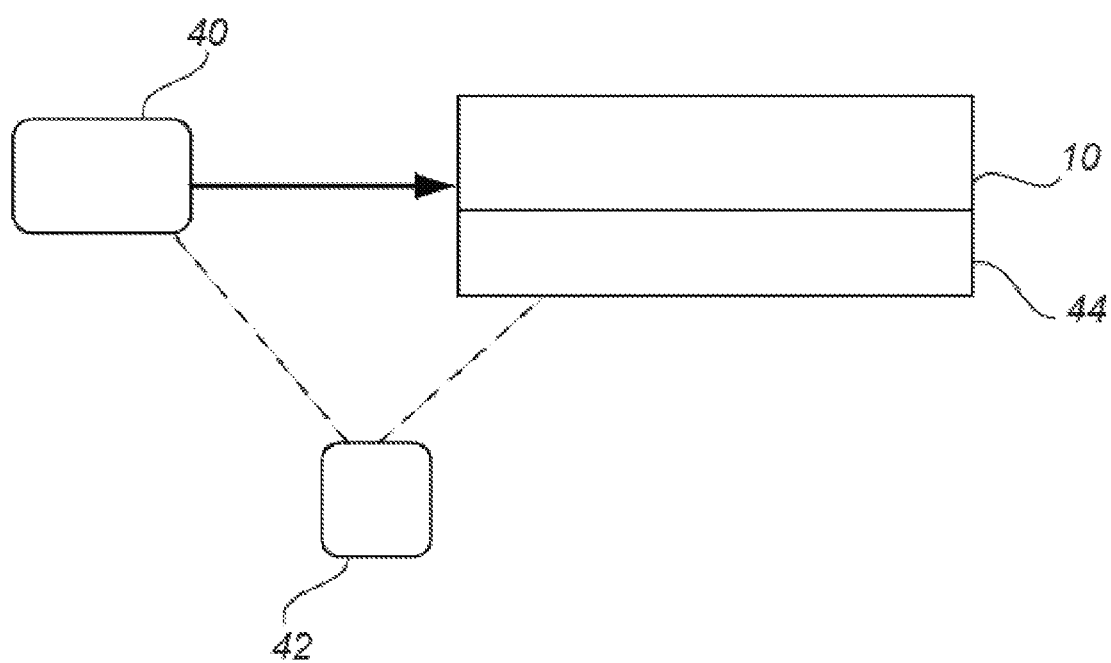
FIG. 11 is a schematic depiction of a cooling surface attached to a chip, and including a pump and a controller according to one embodiment.

As shown schematically in FIG. 11, a pump 40 can be used to pump the liquid refrigerant into one or both of the channels 12, 14 and thereby prevent all of the refrigerant from vaporizing. Rather, while some of the refrigerant will turn to vapor during the heat transfer process, the pump 40 replenishes the refrigerant to the cooling surface 10 so that a combination of liquid refrigerant and vapor is present in the sets of channels 12, 14. The pump 40 can continuously supply refrigerant to the sets of channels 12, 14. Alternatively, a controller 42 for the pump 40 may be used to monitor the temperature of the chip 44 and activate the pump 40 only when the temperature increases to a predetermined amount.

Supplying refrigerant to the sets of channels 12, 14 (either continuously or with a sensor) ensures that the sets of fins 16, 18 remain coated with refrigerant. It is desirable that only a thin film of the refrigerant coat the sets of fins 16, 18. The heat transfer coefficient is a measure of how effectively heat is transferred away from the chip 44—a higher heat transfer coefficient ensures that heat is more effectively transferred away. A thin film of refrigerant is preferred because the heat transfer coefficient is inversely proportional to the thickness of the refrigerant layer on the sets of fins 16, 18. Accordingly, a thin film of refrigerant ensures a high heat transfer coefficient, thereby improving the ability of the cooling surface 10 to transfer heat away from the chip 44.

Provision of two sets of channels 12, 14 formed by two sets of fins 16, 18 in cooling surface 10 is particularly beneficial in this application. By forming two sets of fins 16, 18, the fin height of the surface 10 and consequently the surface area available for contact with the refrigerant is essentially doubled, as compared to a cooling surface that has only a single set of channels and fins. The increased surface area allows more heat to be conducted into the refrigerant and away from the chip 44.

FIGS. 1 and 9 illustrate surfaces 10 where the upper set of fins 18 and channels 14 are formed at substantially 90° relative to the lower set of fins 16 and channels 12. As explained above, however, the upper and lower sets of fins and channels need not be oriented 90° relative to each other. Rather, the upper and lower sets of fins and channels may be formed at acute angles relative to each other, as shown in FIG. 10.

In one embodiment of the current invention, the cooling surface 10 can be stretched after the cooling surface 10 is formed. Stretching is particularly suitable with surfaces 10 having set of fins 16, 18 and channels 12, 14 oriented at acute angles relative to each other. Stretching leads to manufacturing conveniences. As opposed to manufacturing a variety of cooling surfaces 10 each with characteristics (fin height, pitch, etc.) intended for a specific application, a single cooling surface 10 may be manufactured and then stretched to tailor the surface to a particular application. For example, stretching the cooling surface 10 can increase the fin pitch or alter the aspect ratio. Moreover, as explained above, all of the fins in a set of fins 16, 18 need not have the same fin pitch or fin count and indeed it may be desirable that they do not. Stretching the cooling surface 10 allows selective variation of the fin characteristics within a set of fins 16, 18 to better tailor the cooling surface 10 to a particular application and thus enhance the effectiveness of the cooling surface 10. FIG. 10 illustrates a partially-stretched cooling surface 10. The portion of the surface 10 in the lower left hand corner of FIG. 10 has been stretched to a lesser degree than the remaining portions of the surface 10.

The foregoing is provided for the purpose of illustrating, explaining and describing embodiments of the present invention. Further modifications and adaptations to these embodiments will be apparent to those skilled in the art and may be made without departing from the spirit of the invention or the scope of the claims.

The invention claimed is:

1. A method of forming a cooling system for transferring heat from an electronic component comprising:
   a. providing a blank comprising a first side and a second side opposite to the first side;
   b. forming a first set of fins extending from the first side of the blank and defining a first set of channels;
   c. forming a second set of fins extending from the second side of the blank and at an acute angle to the first set of fins, the second set of fins defining a second set of channels;
   d. creating a plurality of passageways extending through the blank and connecting the first and second sets of channels;
   e. stretching the blank after at least some of the fins are formed; and
   f. attaching the blank to an electronic component.

2. The method of claim 1, wherein the blank comprises a thickness and at least some of the channels of the first or second set of channels extend more than halfway through the blank thickness to create a plurality of passageways that extend through the blank and connect the first and second sets of channels.

3. The method of claim 1, wherein forming the first and second sets of fins comprises cutting layers into the blank and lifting the layers to form the fins.

4. The method of claim 1, wherein the fins of the first set of fins and the second set of fins comprise tips and wherein the method further comprises flattening the tips of at least some of the fins of either the first or second set of fins.

* * * * *